US005696385A

United States Patent [19]

Song et al.

[11] Patent Number: 5,696,385

[45] Date of Patent: Dec. 9, 1997

[54] FIELD EMISSION DEVICE HAVING REDUCED ROW-TO-COLUMN LEAKAGE

[75] Inventors: John Song, Tempe; Thomas Nilsson, Phoenix, both of Ariz.

[73] Assignee: Motorola, Schaumburg, Ill.

[21] Appl. No.: 767,246

[22] Filed: Dec. 13, 1996

[51] Int. Cl.[6] .................................................. H01L 29/06

[52] U.S. Cl. .............................. 257/10; 257/77; 313/309; 313/336; 313/351

[58] Field of Search .............................. 257/10, 77, 622, 257/623; 313/309, 310, 336, 351; 445/50

[56] References Cited

U.S. PATENT DOCUMENTS 5,420,443 5/1995 Dreifus et al. ............................ 257/77
5,606,215 2/1997 Jaskie et al. ............................ 313/309

OTHER PUBLICATIONS

Jayshree Seth et al., "Lithographic Application of Diamond–Like Carbon Films", Thin Solid Films vol. 254, 1995, pp. 92–95. no month.

D. Wang et al., "Lithography Using Electron Beam Induced Etching of a Carbon Film", J. Vac. Sci. Technol., Sep./Oct. 1995, pp. 1984–1987.

*Primary Examiner*—Minh-Loan Tran
*Attorney, Agent, or Firm*—Eugene A. Parsons

[57] ABSTRACT

A method for fabricating a diamond-like carbon field emission device (300, 800) includes the steps of: (i) forming on a column conductor (330, 830) a ballast layer (364), (ii) forming on the ballast layer (364), in registration with a central well region (332, 832) of the column conductor (330, 830), a surface emitter (370, 870) made from diamond-like carbon, (iii) forming on the ballast layer (364) and surface emitter (370, 870) a field shaping layer (374), (iv) pattering the ballast layer (364) and the field shaping layer (374) to form a ballast (365) and field shaper layer (377) having opposed edges which, with the opposed edges of the column conductor (330, 830), define smooth, continuous surfaces (371, 871), (v) depositing a blanket dielectric layer (341), and (vi) forming an emission well (360, 860) above the central well region (332, 832) of the column conductor (330, 830).

6 Claims, 7 Drawing Sheets

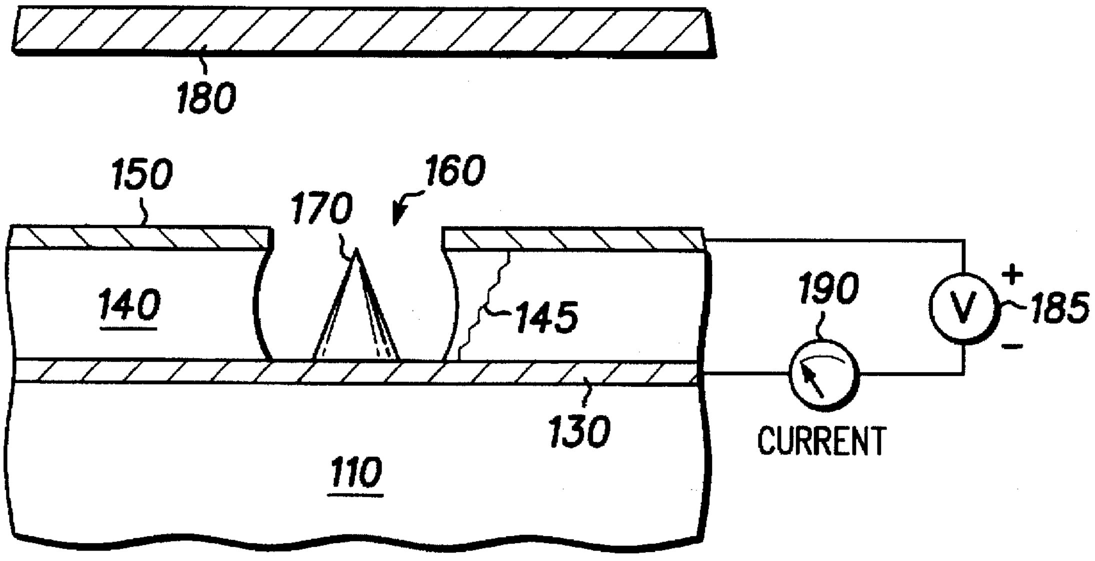
FIG. 1 100 - PRIOR ART -
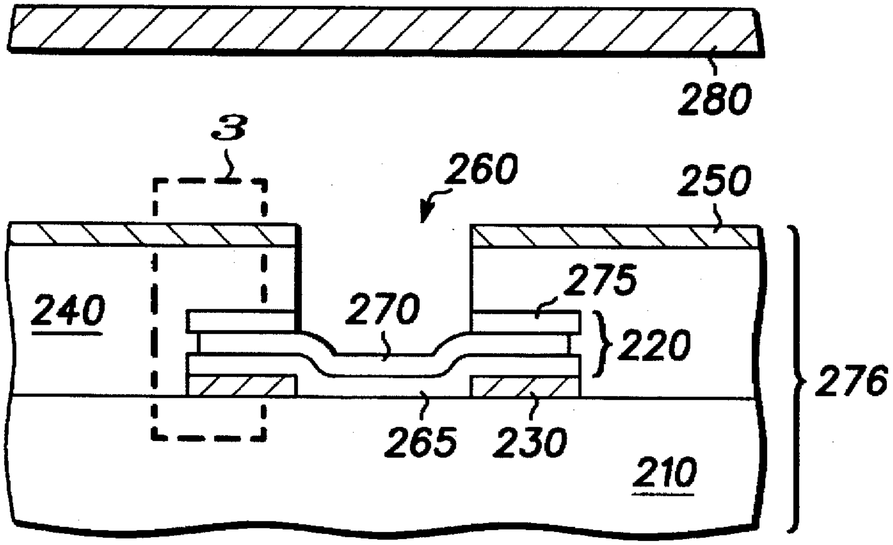
FIG. 2 200

(1x1 MATRIX)

FIELD EMISSION DEVICE HAVING REDUCED ROW-TO-COLUMN LEAKAGE

FIELD OF THE INVENTION

The present invention pertains to field emission devices and more specifically to triode field emission devices including a diamond-like-carbon surface emitter.

BACKGROUND OF THE INVENTION

Field emission devices are known in the art. In one configuration, the field emission device, a diode, includes two electrodes: a cathode and an anode; in another common configuration the field emission device, a triode, includes three electrodes: a cathode, a gate electrode, and an anode. Illustrated in FIG. 1 is a prior art field emission device (FED) 100 having a triode configuration. FED 100 includes a gate extraction electrode 150 (also known as a row) which is spaced from a conductive layer 130 (also known as a column) by a dielectric layer 140. Conductive layer 130 is formed on a supporting substrate 110. Dielectric layer 140 precludes the formation of electrical currents between gate extraction electrode 150 and conductive layer 130. Spaced from gate extraction electrode 150 is an anode 180, which is made from a conductive material. Dielectric layer 140 has lateral surfaces which define an emitter well 160. An electron emitter 170 is disposed within emitter well 160 and may include a Spindt tip. During the operation of FED 100, and as is typical of triode operation in general, suitable voltages are applied to gate extraction electrode 150, conductive layer 130, and anode 180 for extracting electrons from electron emitter 170 and causing them to be directed toward anode. One of the failure mechanisms of FED 100 is the presence of a defect 145 in dielectric layer 140. Defect 145 may include a crack or void extending between gate extraction electrode 150 and conductive layer 130, thereby providing a conduction path and precluding the desired electrical isolation therebetween. If a voltage source 185 provides a potential difference between gate extraction electrode 150 and conductive layer 130, a current is measured by an ammeter 190 in series within the circuit, which is completed by the undesired defect 145. Similar defects have been observed in the development of triode field emission devices employing emissive films, such as diamond-like carbon films.

Thus, there exists a need for a method for fabricating field emission devices, employing field emissive films, which prevents the formation of defects within the dielectric layer and reduces row-to-column current leakage.

BRIEF DESCRIPTION OF THE DRAWINGS

Referring to the drawings:

FIG. 1 is a cross-sectional view of a prior art field emission device;

FIG. 2 is a cross-sectional view of a field emission device;

DESCRIPTION OF THE PREFERRED EMBODIMENT

Figure 3:
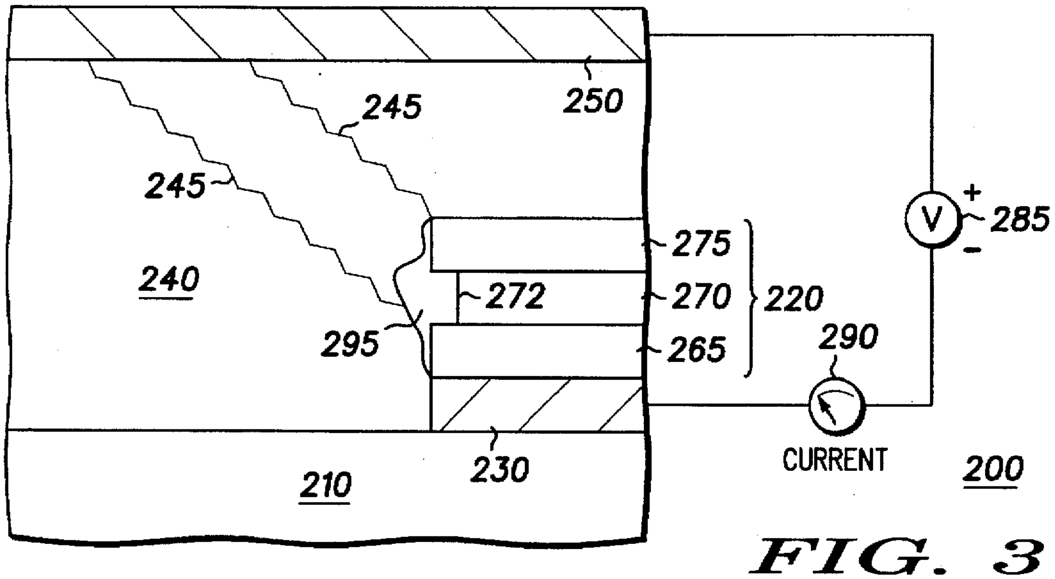
FIG. 3 is an enlarged partial view of the field emission device of FIG. 2.
Figure 4:
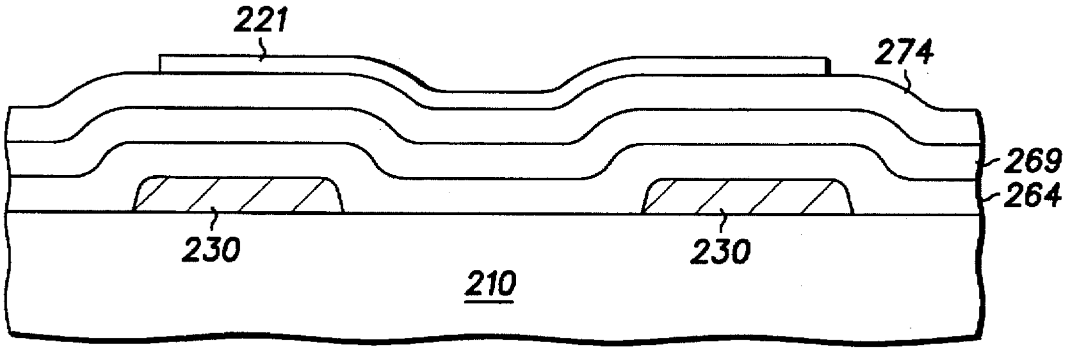
FIGS. 4–8 are cross-sectional views of structures realized in the formation of the field emission device of FIGS. 2 and 3.
Figure 5:
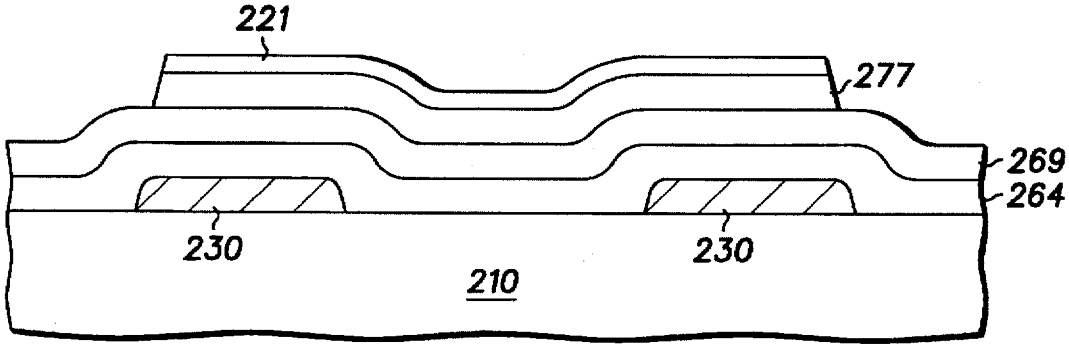
Figure 6:
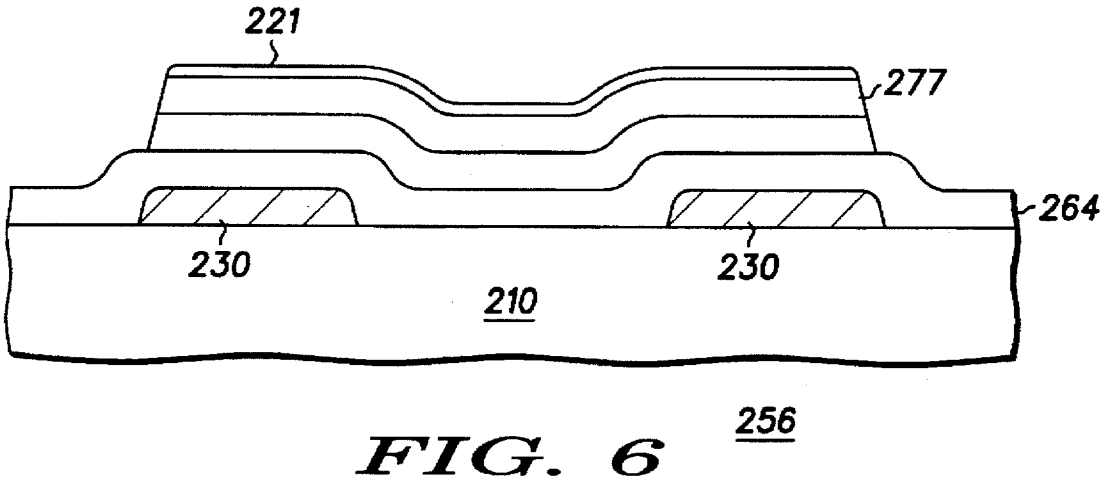
Figure 7:
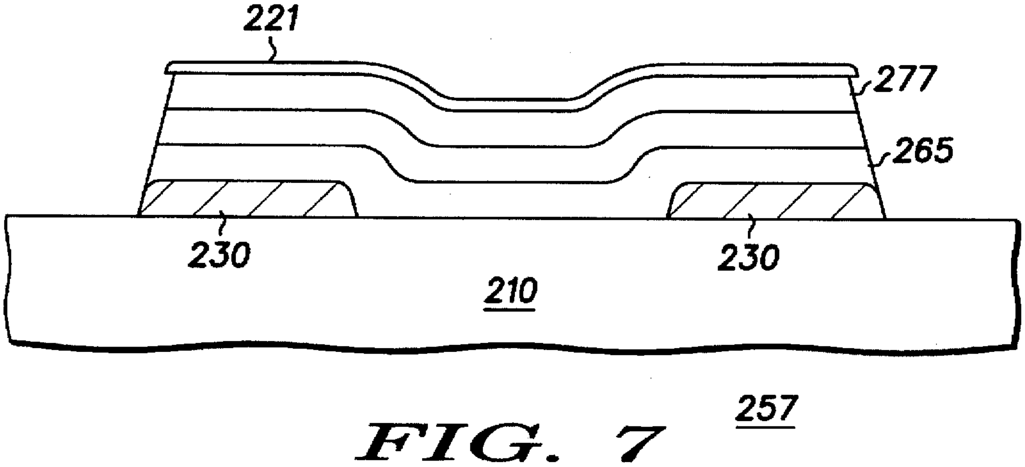

Referring now to FIG. 2, there is depicted a cross-sectional view of a field emission device 200. Field emission device 200 includes a cathode 276, which includes a supporting substrate 210, which may be made from glass, such as borosilicate glass, or silicon. Upon a major surface of supporting substrate 210 is formed a column conductor 230, which is made from a suitable conductive material, such as aluminum or molybdenum. An emissive structure 220 is formed on column conductor 230. Emissive structure 220 includes three layers: a ballast 265, which is deposited upon column conductor 230 and includes a resistive material such as doped amorphous silicon; a surface emitter 270, which is formed on ballast 265 and is made from a suitable field emissive material such as, for example, diamond-like carbon, cubic boron nitride, or aluminum nitride; and a field shaper 275, which is disposed on a portion of surface emitter 270 and is made from a resistive material such as amorphous silicon. A dielectric layer 240 is formed on field shaper 275 and includes lateral surfaces which define an emission well 260. Dielectric layer 240 is made from a suitable dielectric material, such as silicon dioxide. Surface emitter 270 defines an emissive surface disposed within emission well 260. A row conductor 250 is deposited on dielectric layer 240 and is spaced from surface emitter 270. An anode 280 is spaced from row conductor 250. The operation of field emission device 200 includes applying potentials to column conductor 230, row conductor 250, and anode 280 suitable to produce electron emission from surface emitter 270 and to guide the extracted electrons toward anode 280 at an appropriate acceleration. Field shaper 275 aids in shaping the electric field in the region of surface emitter 270. Ballast 265 provides suitable electrical resistance between surface emitter 270 and column conductor 230 to prevent arcing between surface emitter 270 and anode 280.

Referring now to FIG. 3, there is depicted an enlarged partial view of field emission device 200 including an edge of emissive structure 220. At the edge of emissive structure 220, a void 295 is defined by dielectric layer 240 and an edge 272 of surface emitter 270. As will be described in greater detail below, it has been observed that void 295 results from over- etching of the field emissive material during the formation of emissive structure 220. As a result of void 295, stresses are created within dielectric layer 240 which result in the formation of cracks 245 therein. Cracks 245 define current leakage paths between row conductor 250 and column conductor 230 which result in undesirable row-to-column leakage during the operation of field emission device 200. When a potential difference is applied between row conductor 250 and column conductor 230 by a potential source 285, a current is measured by an ammeter 290 which is in the circuit completed by cracks 245. The creation of void 295 will be described presently.

Figure 8:
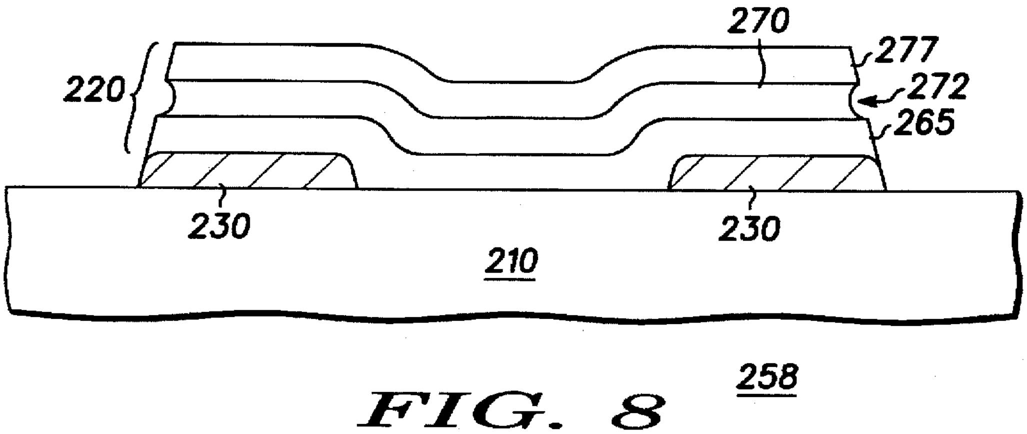

Referring now to FIGS. 4–8, there are depicted cross-sectional views of a plurality of structures 254, 255, 256, 257, 258 realized in the formation of emissive structure 220 of field emission device 200 (FIGS. 2 and 3). First, a ballast layer 264 is deposited on column conductor 230 and includes a layer of amorphous silicon which is doped with boron to a concentration of about $10^{16}$ $cm^{-3}$ of boron. Thereafter, a layer 269 of a diamond-like carbon is deposited onto ballast layer 264. Then, a field shaping layer 274 of amorphous silicon is formed on layer 269. Then, layers 264, 269, 274 are patterned to set emissive structure 220 on top of column conductor 230. This includes, first, forming a patterned layer 221 of photoresist on field shaping layer 274 to realize structure 254 depicted in FIG. 4; then, etching through field shaping layer 274 using, for example, $SF_6$ chemistry, to define a field shaper layer 277 and thereby realizing structure 255 depicted in FIG. 5; thereafter, etching through layer 269 using, for example, an oxygen plasma to produce structure 256 depicted in FIG. 6; and, finally, etching through ballast layer 264, thereby forming ballast 265 and realizing structure 257 depicted in FIG. 7. The photoresist employed is a common variety, supplied by Hoechst Celanese, product number AZ5214, for which a suitable etchant includes an oxygen plasma. As indicated above, oxygen plasma is also an etchant with respect to the diamond like carbon. However, the etch rate of the diamond-like carbon by an oxygen plasma is much greater than that of the photoresist. Therefore, as illustrated if FIG. 6, those portions of the diamond-like carbon which lie outside column conductor 230 are removed well before the photoresist is removed. After etching ballast layer 264, layer 221 of photoresist is removed using an oxygen plasma to produce structure 258, shown in FIG. 8. The oxygen plasma simultaneously attacks the exposed edges of the field emission material, thereby forming undercut edge 272 of surface emitter 270, as shown in FIG. 8. When the dielectric material is deposited on structure 258, it is unable to conform to the uneven edge of emissive structure 220, thereby forming void 295, as illustrated in FIG. 3.

Figure 9:
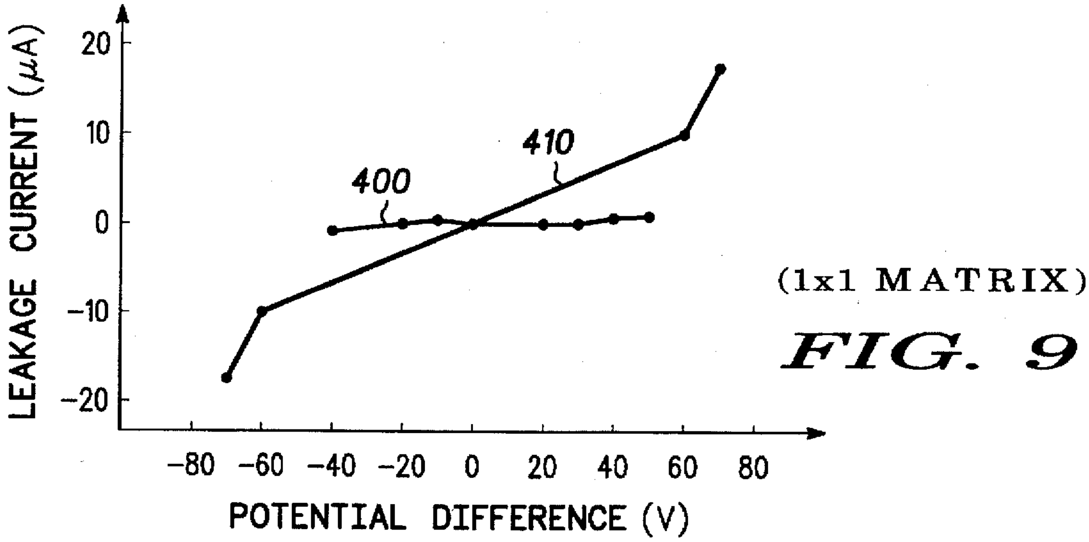
FIG. 9 is a graphical representation of the row-to-column current leakage exhibited by a field emission device fabricated in the manner described with reference to FIG. 2.
Figure 10:
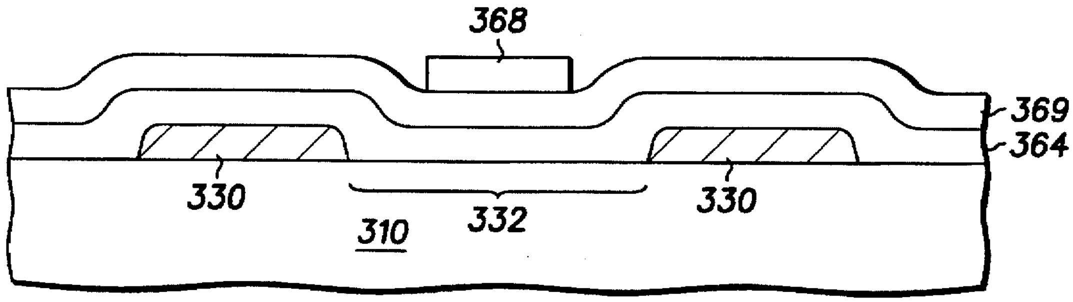
FIGS. 10–15 are cross-sectional views of structures realized by performing various steps of a method for fabricating a field emission device having reduced row-to-column leakage, in accordance with the present invention.

Referring now to FIG. 9, there are depicted graphical representation 400, 410 of the row-to-column current leakage exhibited by a field emission device fabricated in the manner described with reference to FIG. 2. The current measurements were made in the manner described with reference to FIG. 3, while addressing a single pixel, or one row-column intersection, having nine emission wells, each of which were about 4 micrometers in diameter and 1 micrometer deep. Graphs 400, 410 comprise measurements taken at different pixels within an array of pixels of the field emission device. The leakage current depicted by graph 410 is substantial, having a value of about 20 microamps for a row-column potential difference of 70 volts, which is a commonly used value. This level of leakage current is unacceptable. The leakage current at the site represented by graph 400 shows measurable leakage at voltages above 30 volts.

Figure 11:
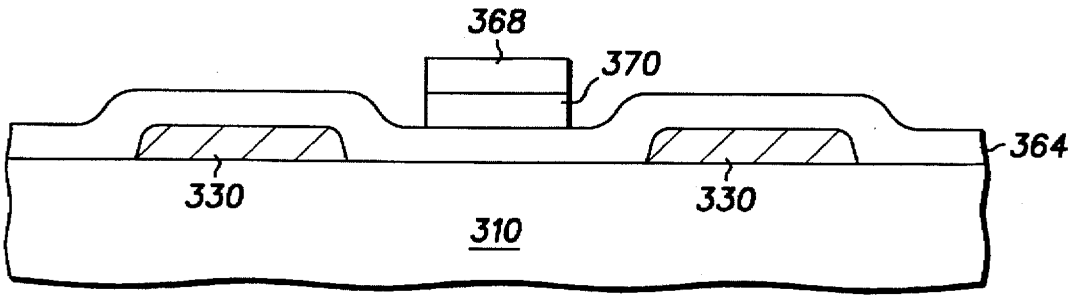
Figure 12:
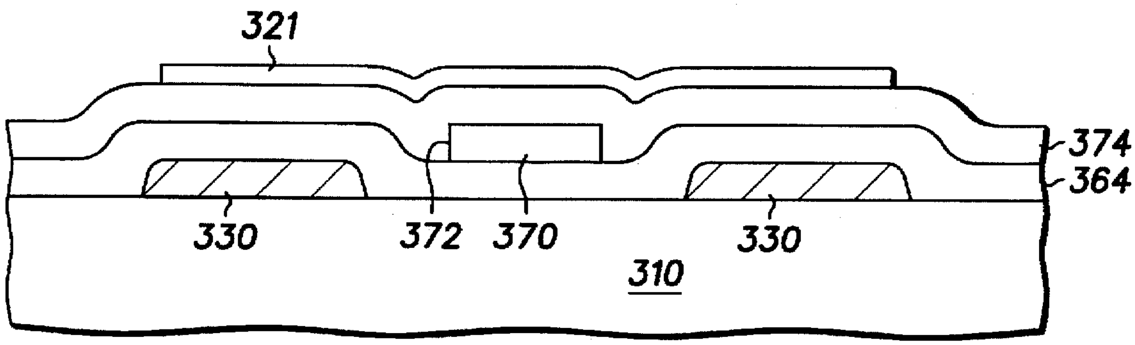
Figure 13:
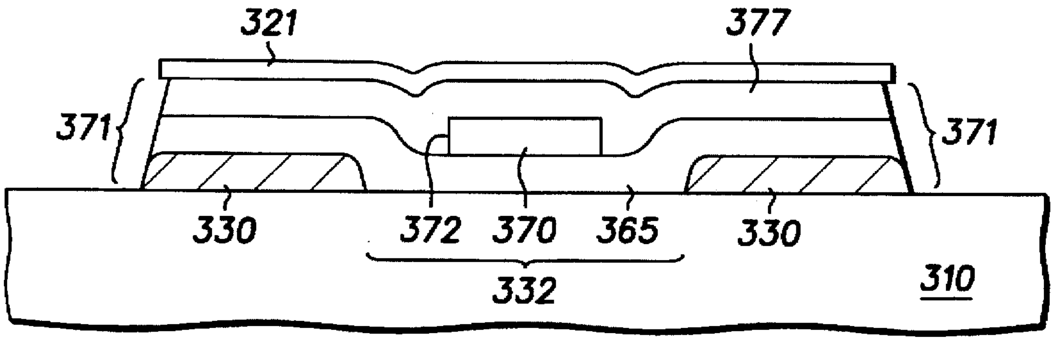
Figure 14:
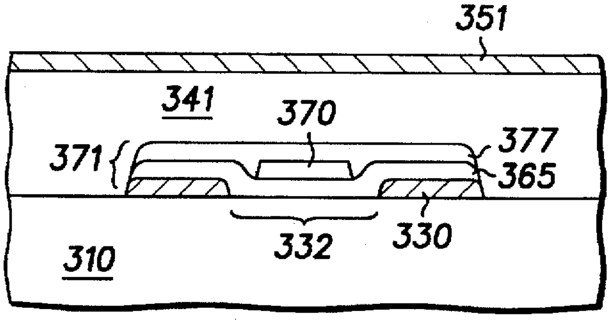
Figure 15:
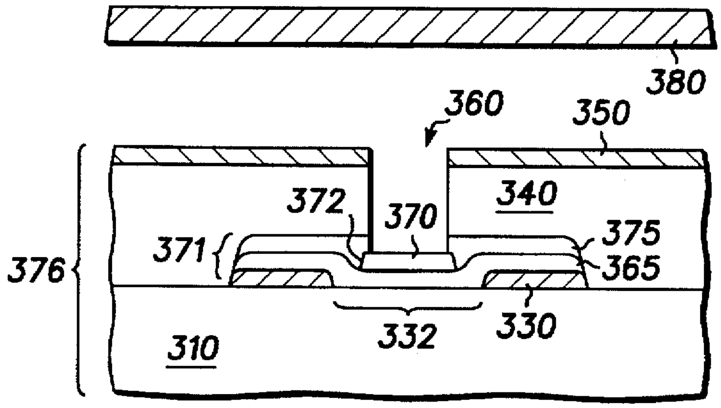

Referring now to FIGS. 10–15, there are depicted cross-sectional views of a plurality of structures 354, 355, 356, 357, 358 (FIGS. 10–14) realized by performing various steps of a method for fabricating a field emission device 300 (FIG. 15) having reduced row-to-column leakage, in accordance with the present invention. Structure 354 includes a supporting substrate 310, which may be made from glass, such as borosilicate glass, or silicon. Upon a major surface of supporting substrate 310 is formed a column conductor 330, which is patterned to have a central well region 332. Upon column conductor 330 is deposited a ballast layer 364. In this particular embodiment, ballast layer 364 includes a layer of amorphous silicon which is doped to impart a resistivity within the range of 100 Ωcm–10,000 Ωcm. This may be achieved by doping the amorphous silicon with boron to a concentration within a range of $10^{10}$–$10^{18}$ $cm^{-3}$, preferably $10^{16}$ $cm^{-3}$, by implantation of boron at 30 keV. Other suitable ballasting materials, having resistivities within the aforementioned range, may be used to form ballast layer 364. Thereafter, a layer 369 of diamond-like carbon, having a thickness of about 1000 angstroms, is formed on ballast layer 364. Other field emissive materials may be employed, including field emissive carbon-based materials. Methods for forming field emissive films of carbon-based materials, including diamond-like carbon, are known in the art. For example, an amorphous hydrogenated carbon film can be deposited by plasma-enhanced chemical vapor deposition using gas sources such as cyclohexane, n-hexane, and methane. One such method is described by Wang et al. in "Lithography Using Electron Beam Induced Etching of a Carbon Film", *J. Vac. Sci. Technol.* September/October 1995, pp. 1984–1987. The deposition of diamond films is described in U.S. Pat. No. 5,420,443 entitled "Microelectronic Structure Having an Array of Diamond Structures on a Nondiamond Substrate and Associated Fabrication Methods" by Dreifus et al., issued May 30, 1995. The deposition of a diamond-like carbon film is further described in "Lithographic Application of Diamond-like Carbon Films" by Seth et al., *Thin Solid Films,* 1995, pp. 92–95. Other suitable field emissive materials are described in the following patent applications, having the same assignee: "Electronemissive Film and Method" by Coll et al., Ser. No. 08/720,512, filed Sep. 30, 1996; and "Amorphous Multi-Layered Structure and Method of Making the Same" by Menu et al., Ser. No. 08/614,703, filed Mar. 13, 1996. After the formation of layer 369, a patterned hardmask 368, about 1000 angstroms thick, is formed on layer 369, in registration with central well region 332 of column conductor 330, thereby realizing structure 354 of FIG. 10. The diamond-like carbon is dry etched using an oxygen plasma, thereby forming a surface emitter 370 generally in registration with central well region 332, to realize structure 355 shown in FIG. 11. To realize structure 356 of FIG. 12, hardmask 368 is first removed from structure 355 (FIG. 11). Thereafter, a field shaping layer 374 of amorphous silicon, about 2000 angstroms thick, is formed on surface emitter 370 and ballast layer 364. Field shaping layer 374 and ballast layer 364 are etched to generally overlie column conductor 330. This is done by depositing a patterned layer 321 of photoresist on field shaping layer 374 and using a suitable etchant, such as $SF_6$ or a chlorine/oxygen plasma, to etch through layers 374, 364, thereby realizing structure 357 shown in FIG. 13. Ballast layer 364 and field shaping layer 374 have nearly equal etch rates with respect to the aforementioned etchants, so that the opposed edges of column conductor 330, the opposed edges of a ballast 365, and the opposed edges of a field shaper layer 377 define opposed smooth, continuous surfaces 371. Thereafter, layer 321 of photoresist is removed using an oxygen plasma. During this step, surface emitter 370, including an edge 372, is protected from attack by the etchant. This configuration precludes non-uniform etching at surfaces 371. As illustrated in FIG. 14, when a dielectric layer 341 is thereafter deposited, it easily conforms to surfaces 371, thereby preventing the formation of crack-forming voids. Dielectric layer 341 is deposited to a thickness of about 1 micrometer. A conductive layer 351 made from, for example, molybdenum, is then deposited on dielectric layer 341, thereby realizing structure 358. Thereafter, as illustrated in FIG. 15, an emission well 360 is formed by selectively etching portions of conductive layer 351, dielectric layer 341, and field shaper layer 377, thereby forming a row conductor 350, a dielectric layer 340, and a field shaper 375. Emission well 360 generally overlies central well region 332 and is in registration with surface emitter 370, which defines the bottom surface of emission well 360. An emissive structure 320 is comprised of field shaper 375, surface emitter 370, and ballast 365. FED 300 further includes an anode 380 spaced from row conductor 350 of a cathode 376. The operation of FED 300 includes applying appropriate potentials (by using potential sources, not shown) to column conductor 330 and row conductor 350 for extracting electrons from surface emitter 370 and applying a high positive potential at anode 380 for accelerating the extracted electrons toward anode 380. An example of a suitable potential configuration includes: column conductor 330 at ground; row conductor 350 at +80 volts; and anode 380 at +4000 volts.

In another embodiment of the present invention, the ballast layer is made from the field emissive material, the field emissive material having a resistivity within the ballasting range. In this instance, the ballast layer is patterned to form a ballast having opposed edges which are disposed inwardly, toward the central well region, and on the metal portion of the column conductor. Thereafter, when the field shaping layer is formed on the ballast, the field shaping layer covers the opposed edges of the ballast. The field shaping layer is then selectively etched to overlie the column conductor and to form, in conjunction with the opposed edges of the column conductor, smooth surfaces to which the dielectric layer can conform. The emissive material is thereby protected during the step of patterning the field shaping layer. The emission well is formed by selectively etching through the dielectric and the field shaper layer, to expose a portion of the emissive material of the ballast, thereby providing the surface emitter.

Figure 16:
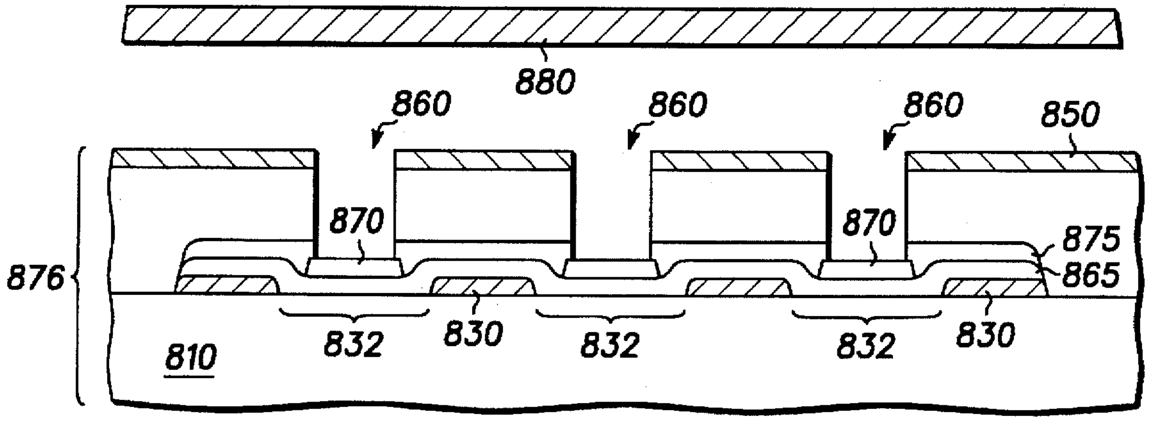
FIG. 16 is a cross-sectional view of a pixel of another embodiment of a field emission device realized by performing various steps of a method for fabricating a field emission device having reduced row-to-column leakage, in accordance with the present invention.
Figure 17:
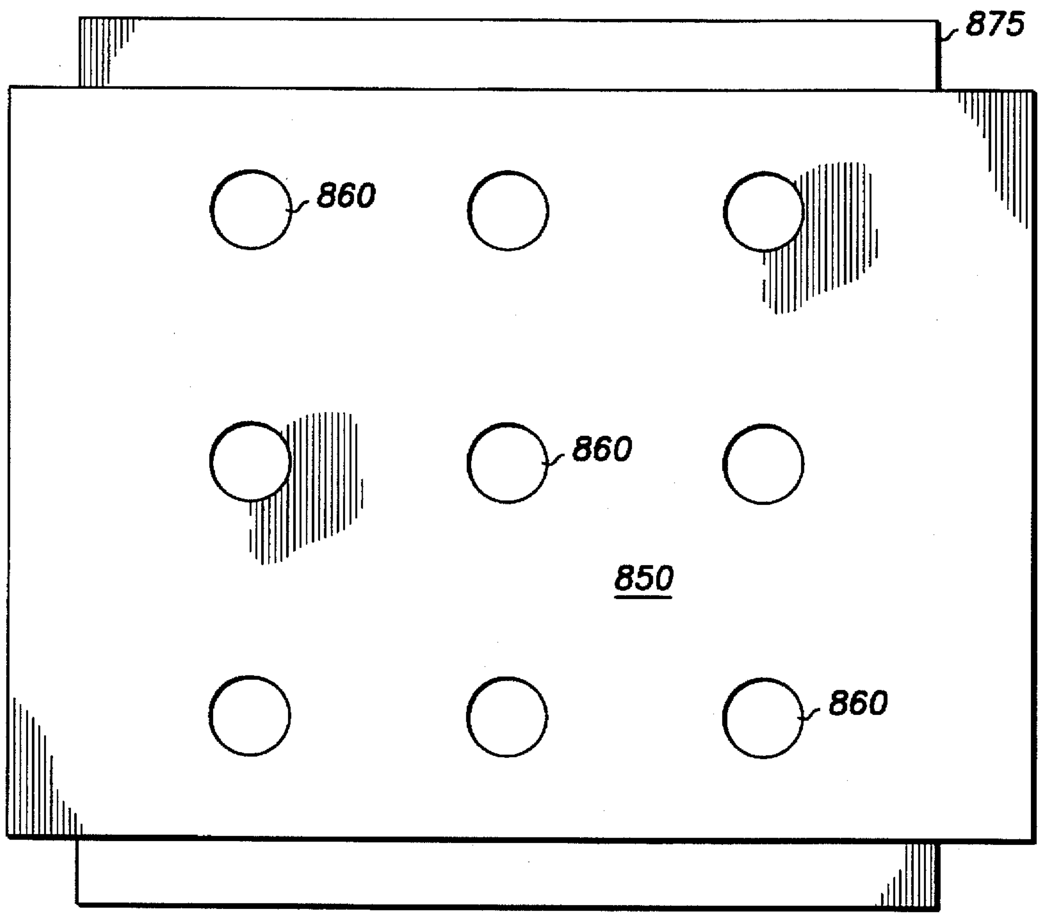
FIG. 17 is a top plan view of a portion of a cathode of the field emission device of FIG. 16.

Referring now to FIGS. 16 and 17, there are depicted a cross-sectional view (FIG. 16) of a pixel of a field emission device 800, which was made by a method for fabricating a field emission device having reduced row-to-column leakage, in accordance with the present invention, and a top plan view (FIG. 17) of a pixel of a cathode 876 of field emission device 800 of FIG. 16. Field emission device 800 was made in the manner described with reference to FIGS. 10–15, and elements are similarly referenced, beginning with an "8". In this particular embodiment, a column conductor 830 includes three central well portions 832, over which are formed three emission wells 860, each having a surface emitter 870 disposed therein. Each of the pixels of field emission device 800, as illustrated in FIG. 17, included nine emission wells 860 at each overlapping region between a row conductor 850 and column conductor 830. Field emission device 800 included an array of 32×32 row and column conductors, defining 1024 pixels such as depicted in FIGS. 16 and 17.

Figure 18:
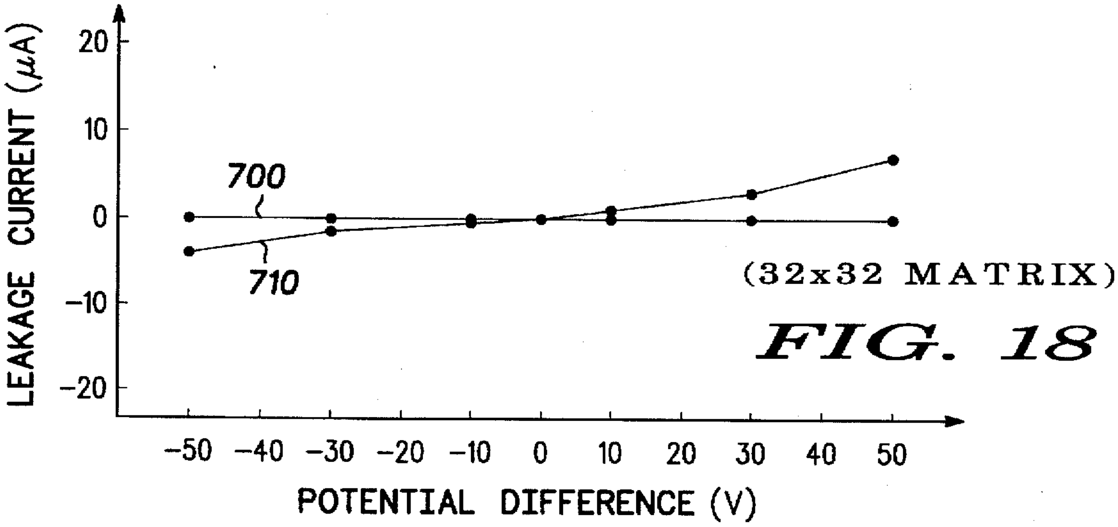
FIG. 18 is a graphical representation of the row-to-column current leakage measured at various potential differences applied to the field emission device of FIGS. 16 and 17.

Referring now to FIG. 18, there are depicted graphical representations 700, 710 of row-to-column current leakage currents (in microamperes) exhibited by the 1024 pixels of cathode 876 of field emission device 800 (FIGS. 16 and 17). The leakage current measurements were made in the manner described with reference to FIG. 3. Graphs 700, 710 comprise measurements taken from two identically configured arrays which were separately fabricated. These measurements include the leakage current contributions of about 1000 times more pixels than those depicted in FIG. 9. Graph 700 shows no measurable leakage current for all voltages; graph 710 shows a leakage current of about 7 microamperes at a potential difference of 50 volts, or about 7 nanoamperes per pixel. This level of leakage current is acceptable. Field emission device 800, fabricated using a method in accordance with the present invention, has a leakage current which is about three orders of magnitude less than that of a field emission device (FIG. 9) having the pixel configuration shown in FIG. 17 and being fabricated in the manner described with reference to FIGS. 4–8.

A method for fabricating a field emission device in accordance with the present invention is useful in processes which further include additional processing steps, subsequent the deposition of the surface emitter, wherein the additional step(s) introduce a chemistry which would otherwise attack the field emissive material to create an edge of the emissive structure to which the dielectric cannot conform. By covering the edges of the surface emitter, they are protected during the subsequent processing. Also, the present method may include other field emissive film compositions which are susceptible to attack by processing steps subsequent the formation of the surface emitter. Moreover, the similar compositions of the field shaper and the ballast ensure nearly equal etch rates of these layers by a given etchant, thereby producing a smooth, continuous edge of the emissive structure. The dielectric layer can then easily conform to the edge of the emissive structure, thereby preventing the formation of voids.

While we have shown and described specific embodiments of the present invention, further modifications and improvements will occur to those skilled in the art. We desire it to be understood, therefore, that this invention is not limited to the particular forms shown, and we intend in the appended claims to cover all modifications that do not depart from the spirit and scope of this invention.

We claim:

1. A field emission device having reduced row-to-column leakage comprising:

a supporting substrate having a major surface;

a column conductor formed on the major surface of the supporting substrate and having a central well region and opposed edges;

an emissive structure including

- a ballast disposed on the column conductor having opposed edges coextensive with the opposed edges of the column conductor,
- a surface emitter having opposed edges being in registration with the central well region of the column conductor and spaced from the opposed edges of the ballast,
- a field shaper (375, 875) circumscribing the surface emitter and disposed on the ballast and having opposed edges, the opposed edges of the field shaper being coextensive with the opposed edges of the ballast;

a dielectric layer disposed on the field shaper and on the opposed edges of the column conductor, the opposed edges of the ballast, and the opposed edges of the field shaper;

a row conductor formed on the dielectric layer;

the row conductor, the dielectric layer, the field shaper, and the surface emitter defining an emission well being in registration with a portion of the central well region of the column conductor; and an anode spaced from the row conductor to define an interspace region therebetween whereby the opposed edges of the field shaper, the opposed edges of the ballast, and the opposed edges of the column conductor define smooth, continuous surfaces to which the dielectric layer conforms so that no voids exist in the dielectric layer at the smooth, continuous surfaces.

2. A field emission device having reduced row-to-column leakage as claimed in claim 1 wherein the surface emitter is made from a carbon-based material.

3. A field emission device having reduced row-to-column leakage as claimed in claim 2 wherein the carbon-based material includes diamond-like carbon.

4. A field emission device having reduced row-to-column leakage as claimed in claim 1 wherein the field shaper is made from amorphous silicon.

5. A field emission device having reduced row-to-column leakage as claimed in claim 1 wherein the ballast is made from a material having a resistivity within a range of 100 Ωcm–10,000 Ωcm.

6. A field emission device having reduced row-to-column leakage as claimed in claim 5 wherein the ballast is made from amorphous silicon doped with boron to a concentration within a range of $10^{10}$–$10^{18}$ $cm^{-3}$.

* * * * *